(12) United States Patent
Tung et al.

(10) Patent No.: US 6,574,863 B2
(45) Date of Patent: Jun. 10, 2003

(54) THIN CORE SUBSTRATE FOR FABRICATING A BUILD-UP CIRCUIT BOARD

(75) Inventors: I-Chung Tung, Hsinchu (TW); Han-Kun Hsieh, MiaoLi (TW); Shih-Ping Hsu, Tao Yuan (TW)

(73) Assignee: Phoenix Precision Technology Corporation (TW)

( * ) Notice: Subject to any disclaimer, the term of this patent is extended or adjusted under 35 U.S.C. 154(b) by 78 days.

(21) Appl. No.: 09/839,315

(22) Filed: Apr. 20, 2001

(65) Prior Publication Data

US 2002/0152611 A1 Oct. 24, 2002

(51) Int. Cl.[7] .................................................. H01K 3/00
(52) U.S. Cl. .............................. 29/846; 29/825; 29/830; 29/852
(58) Field of Search .......................... 29/830, 846, 852, 29/825

(56) References Cited

U.S. PATENT DOCUMENTS

| | | | | |
|---|---|---|---|---|
| 4,642,160 A | * | 2/1987 | Burgess | 216/18 |
| 4,915,983 A | * | 4/1990 | Lake et al. | 156/150 |
| 5,567,329 A | * | 10/1996 | Rose et al. | 156/345.1 |
| 5,747,358 A | * | 5/1998 | Gorrell et al. | 216/11 |
| 5,786,270 A | * | 7/1998 | Gorrell et al. | 438/612 |
| 6,005,198 A | * | 12/1999 | Gregoire | 174/262 |

* cited by examiner

*Primary Examiner*—Joseph J. Hail, III
*Assistant Examiner*—Alvin J Grant

(57) ABSTRACT

Disclosed is a method of preparing a thin core substrate for fabricating a build-up multilayer circuit board. The method involves the use of an insulating layer which is covered with the electrically conductive sheets. The openings are made in the electrically conductive layers at the predetermined positions, where the vias are also formed in the insulating layer. An electrically conductive layer is deposited to cover the vias. After the electrically conductive sheets and layer are patterned, a thin core substrate is constructed. The build-up layers are then made at least one side of the thin core substrate to form a build-up multilayer circuit board.

10 Claims, 7 Drawing Sheets

THIN CORE SUBSTRATE FOR FABRICATING A BUILD-UP CIRCUIT BOARD

BACKGROUND OF THE INVENTION

1. Field of the Invention

This invention relates generally to a method of fabricating a multilayer circuit board. More particularly, the present invention relates to a build-up type multilayer circuit board made involving the use of a thin core substrate, on which a stack of thin layers, alternatively insulating and conductive, are deposited and electrically conductive via holes are formed in the insulating layers to provide electrical interconnections among the conductive layers.

2. Description of the Related Art

The desirability of miniaturization of electronic products has long been known, especially for those electronic products, to name just a few, such as cellular phones, hand carry computers, hand carry camcorders, personal digital assistants, etc. These electronic products currently require circuit boards and electronic components to be smaller and thinner than ever before. Following such a trend, there is also a demand to mount the semiconductor elements on a circuit board at a high mounting density. For this end, incorporating the thin and high wiring density multilayer circuit boards into electronic products has thus created many challenges to the circuit board designers and manufacturers.

In the circuit board manufacturing industry, there is continuous pressure to provide a low cost, high reliability and high wiring density circuit board. To accomplish this, the build-up technique has been developed. The so-called build-up technique is basically meant to involve the fabrication of a stacking of thin layers, alternatively insulative and conductive, combined with conductive via holes for interconnecting the different thin conductive layers on a core substrate (or say core circuit board). The number of layers built up can be further increased to more than ten or twenty layers to meet the needs in some applications in the current electronics industry. To date, the build-up circuit boards made by the build-up technique have already been incorporated within a variety of electronic devices in a number of commercial products.

In general, to produce a build-up multilayer circuit board, a single-sided, two-sided board or multilayer board may be used as the core substrate. The typical prior art build-up multilayer circuit boards are illustrated in FIGS. 1 and 2. Referring to FIG. 1, the build-up multilayer circuit board 100 includes a core substrate 101 and a build-up structure 102. The core substrate 101 comprises several patterned conductive layers 103 and an insulating layer 104 formed in between any two adjacent conductive layers 103. A conductive through-hole 105 is made to electrically interconnect the patterned conductive layers 103. The build-up structure 102 comprises the multiple layers of the patterned conductive layers 106 and insulating layers 107, however, commonly which are much thinner than the conductive layers 103 and insulating layers 104 present in the core substrate 101. The vias 108 are formed to electrically interconnect any two adjacent conductive layers 106 within the build-up structure 102. As seen in this example, the core substrate 101 is a multilayer (i.e. six layers) circuit board and the build-up structure 102 has two build-up layers.

Another example of the prior art build-up circuit boards is shown in FIG. 2, in which the build-up circuit board 200 includes a circuit board 201 and a build-up structure 202. The circuit board 201 comprises two patterned conductive layers 203 and one insulating layer 204 located in between the conductive layers 203. A conductive through-hole 205 is made to electrically interconnect the two conductive layers 203. The build-up structure 202 comprises the multiple layers of the patterned conductive layers 206 and insulating layers 207, which are commonly much thinner than the conductive layers 203 and insulating layers 204 present in the core substrate 201. The vias 208 are formed to electrically interconnect any two adjacent conductive layers 206 within the build-up structure 202. As seen in this example, the circuit board 201 is a multilayer (i.e. two layers) circuit board and the build-up structure 202 has two build-up layers on both sides of the core substrate 201, which results in a six-layer circuit board.

In fabricating reliable vias for multilayer circuit boards, currently, there are three types of conductive vias that are prevailing in the industry as shown in FIG. 3. In FIG. 3A is illustrated a so-called plated through hole, in which the via opening extends through the insulating layer 301 and the conductive layers 302 and 303 on both sides of the insulating layer 301 and a conductive layer of plated metal 304 is formed through the via opening. The recess created by the via after plating is filled with a conductive or non-conductive filled material 305 to assure a reliable electrically conductive through hole that is fabricated.

Another further form of the vias is shown in FIG. 3B, in which the via opening extends through the insulating layer 306 but does not extends through the conductive layer 307. After a plated layer 308 is deposited, the recess created by the via is filled with a conductive or non-conductive material 309 to obtain the good planarity for the next processing step.

The third form of the vias fabricated is illustrated in FIG. 3C, in which the via opening extends through the insulating layer 310 but does not extends through the conductive layer 311. After the via opening is completely filled with a conductive material 313, a circuit layer 312 is formed.

As seen, these all three types of the vias require a process of filling a filled material into the recess created by the via, however, which will become infeasible when the via diameter less than 0.05 millimeter. However, in current technological environment, the above three types of the vias used for fabricating a build-up multilayer circuit board, the via diameter should be larger than 0.1 millimeter for facilitating the mass production. Under such a condition, the core substrate made with the use of those conductive vias described will be subjected to a limitation to achieve a further higher wiring density.

It is therefore desirable to provide a thin core substrate having a further higher wiring density for making a further thinner and higher wiring density build-up multilayer circuit board.

SUMMARY OF INVENTION

It is therefore an objective of the present invention to provide a thin core substrate for making a thin and high wiring density build-up multilayer circuit board.

Another objective of this invention is to adopt a method for making a core substrate. The method involves the use of an insulating layer which is covered with the electrically conductive sheets. The openings are made in the electrically conductive layers at the predetermined positions, where the vias are also formed in the insulating layer. An electrically conductive layer is deposited to cover the vias. After the electrically conductive sheets and layer are patterned, a core substrate is constructed.

Another further object is to prepare a thin core substrate for fabricating a build-up multilayer circuit board. The method involves the use of an insulating layer which is covered with the electrically conductive sheets. The openings are made in the electrically conductive layers at the predetermined positions, where the vias are also formed in the insulating layer. An electrically conductive layer is deposited to cover the vias. After the electrically conductive sheets and layer are patterned, a thin core substrate is constructed. Afterwards, the build-up layers are made at least one side of the thin core substrate to form a build-up multilayer circuit board.

DETAILED DESCRIPTION OF A PREFERRED EMBODIMENT

For a better understanding on the advantages and capabilities of the present invention, reference is made to the following disclosure, appended claims in connection with the accompanying drawings. This invention, however, is embodied in many different forms and should not be construed as limited to the embodiments set forth herein. Rather, these embodiments are provided so that this disclosure will be thorough and complete, and will fully convey the scope of the invention to those skilled in the art.

The invention provides a method to make a thin core substrate with smaller vias for the subsequent formation of the build-up layers, which intentionally results in a high wiring density and thin multilayer circuit board. The method is detailed as follows. Like numbers refer to like elements throughout. However, the figures are simply illustrative of the process, and are not drawn to scale, i.e. they do not reflect the actual dimensions or features of the various layers in the multilayer circuit board.

Figure 1:
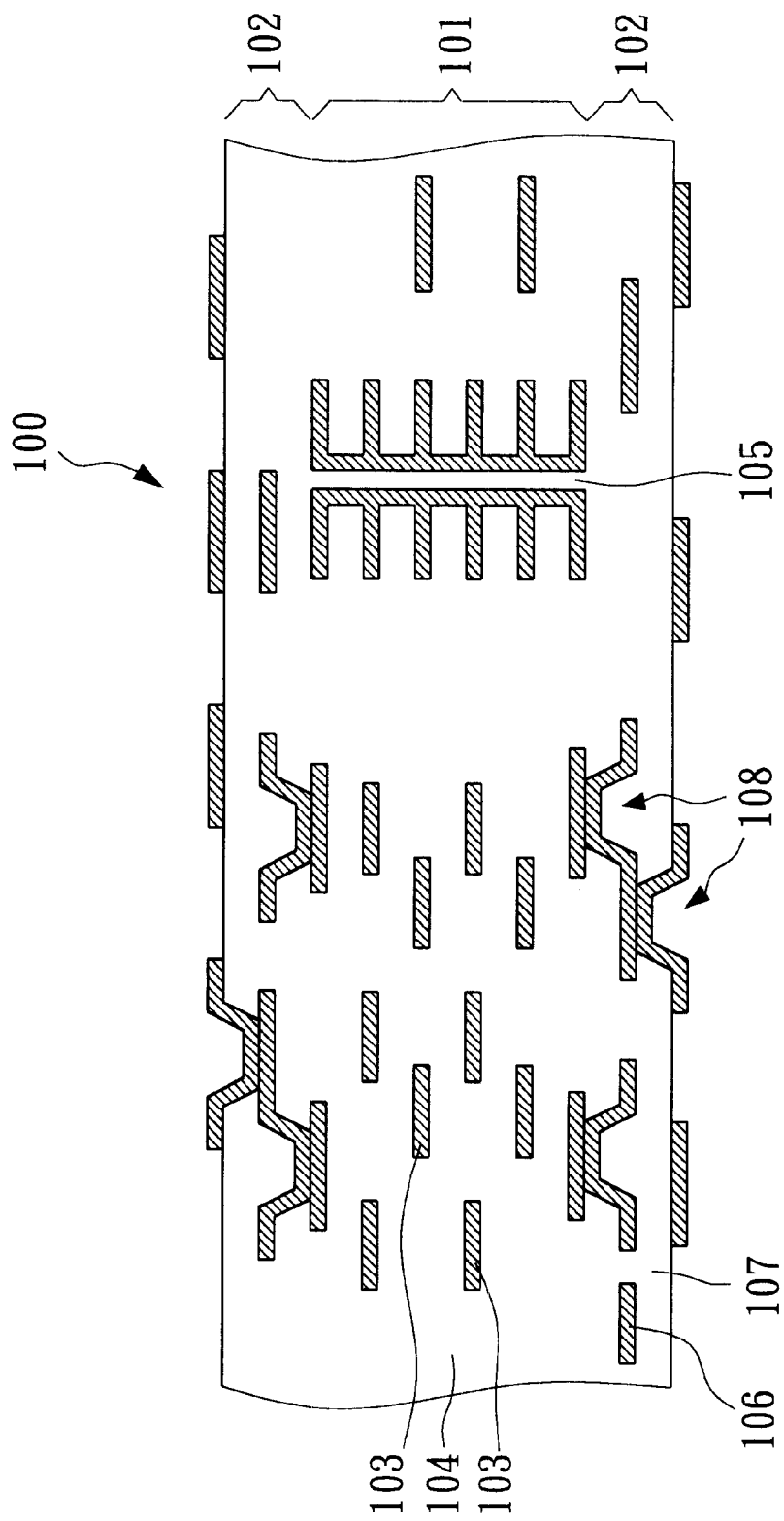
FIG. 1 is a cross-sectional view of a prior art build-up circuit board.
Figure 2:
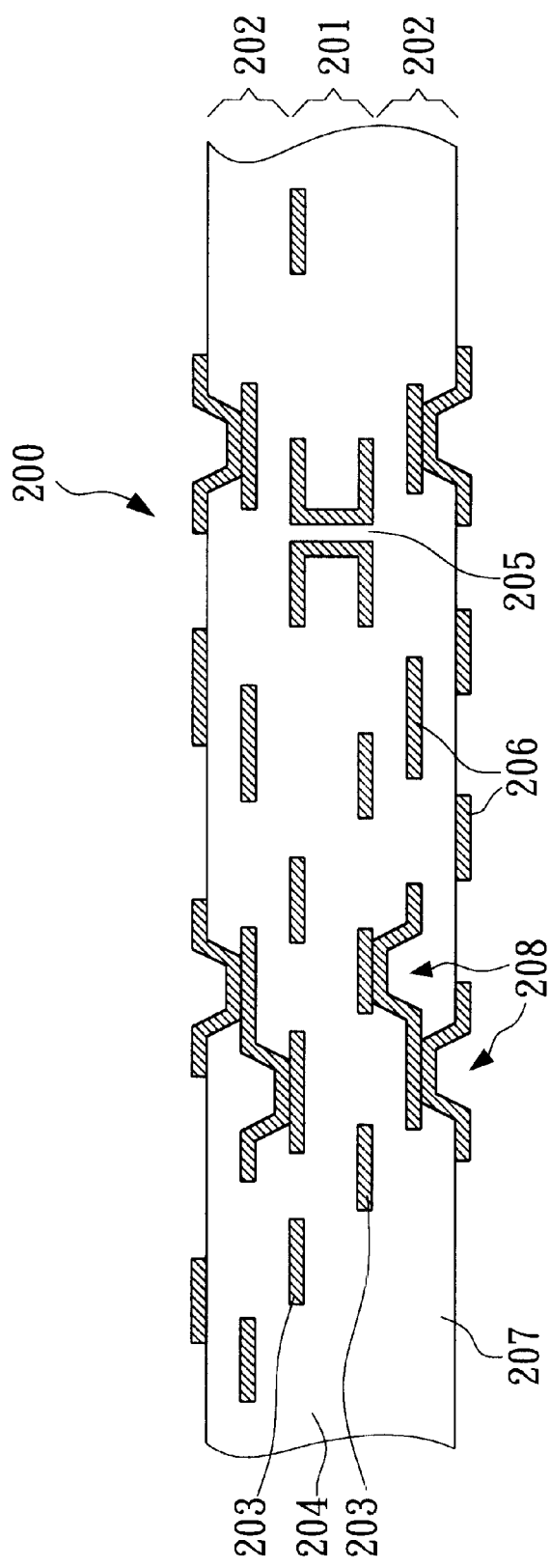
FIG. 2 is another cross-sectional view of a prior art build-up circuit board.
Figure 3A:
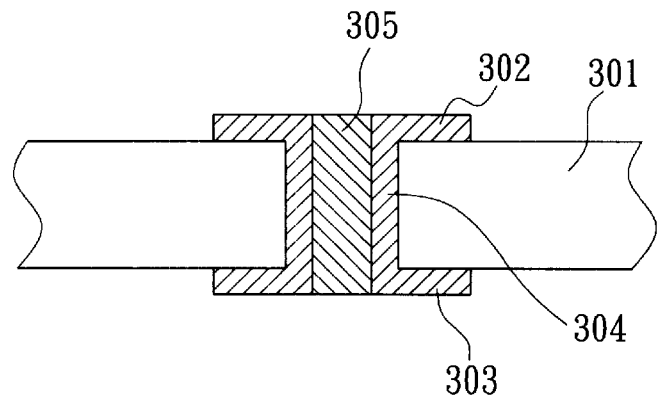
FIG. 3A is a cross-sectional view showing a prior art plated through-hole.
Figure 3B:
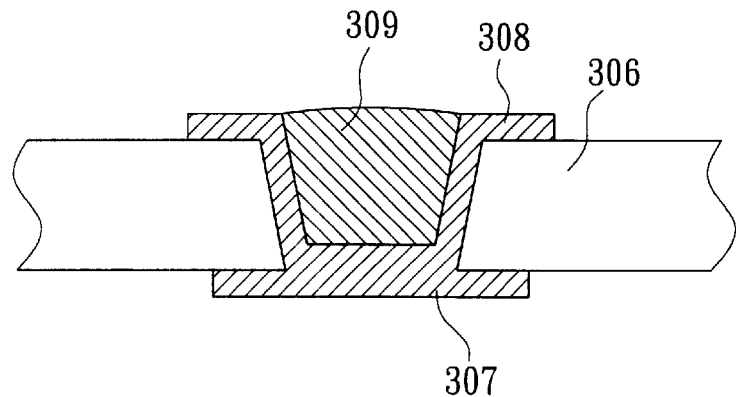
FIG. 3B is a cross-sectional view showing a prior art blind via with the recess filled with a filled material.
Figure 3C:
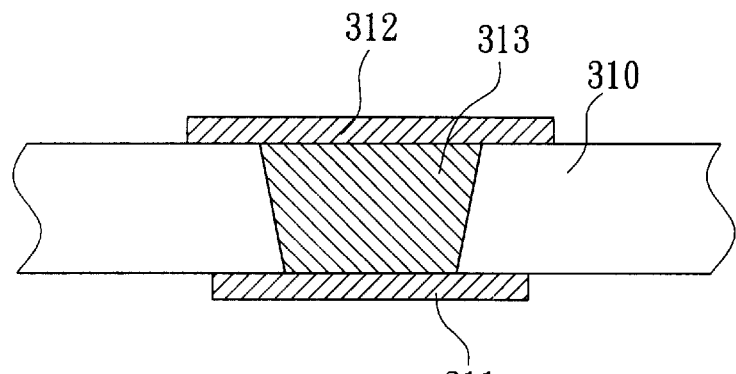
FIG. 3C is a cross-sectional view showing a prior art blind via filled completely with a conductive material.
Figure 4A:
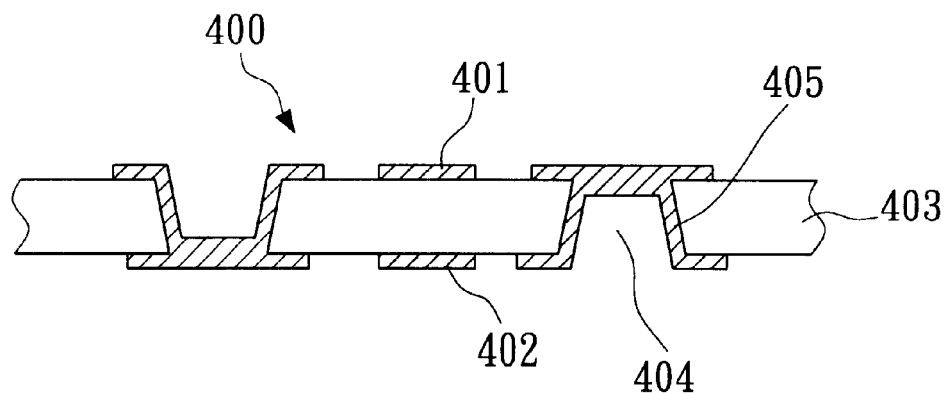
FIG. 4A is a cross-sectional view of a thin core with blind vias having the recess in accordance with a preferred embodiment of the present invention.

In accordance with a preferred embodiment of the present invention, said thin core substrate is simply directed to a two-layer circuit board with blind vias, as schematically shown in FIG. 4. FIG. 4A shows a typical two-layer circuit board 400 with blind vias for serving as a core substrate, in which there are two circuit layers 401 and 402 on both sides of the insulating layer 403 and the blind vias 404 covered with an electrically conductive layer 405 are formed to electrically interconnect two conductive layers 401 and 402. However, the recess created by the vias is not filled fully by the electrically conductive material 405.

Figure 4B:
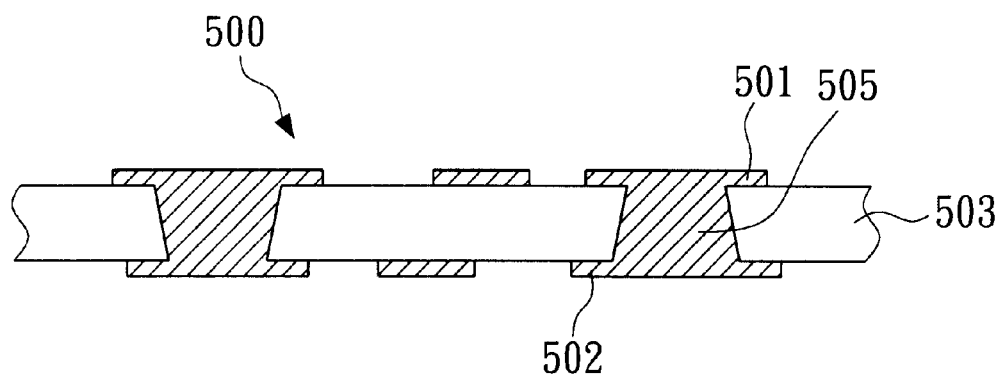
FIG. 4B is a cross-sectional view of a thin core with blind vias filled completely with a conductive material in accordance with a preferred embodiment of the present invention.

FIG. 4B shows another two-layer circuit board 500 with blind vias for serving as a core substrate, in which there are two circuit layers 501 and 502 on both sides of the insulating layer 503 and the blind via openings 504 are completely filled by an electrically conductive material 505.

According to the present invention, the fabrication process sequence of producing said core substrate 400 or 500 comprises the steps as schematically illustrated in FIG. 5. FIG. 5A shows the first step that an organic insulating layer 1, preferably 0.01–0.2 millimeter thick, more preferably 0.01–0.06 millimeter thick, and two thin electrically conductive sheets 2 (preferably copper sheets), preferably 0.008–0.015 millimeter thick, are bonded together. Said insulating layer 1 may be made of an organic dielectric material or a fiber-reinforced organic dielectric material or a particle-reinforced organic dielectric material, etc., for example, epoxy resin, polyimide, bismeleimide triazine, cyanate ester, polybenzocyclobutene, or glass fiber composite thereof, etc. It should be noted here that said insulating layer 1 is not limited to any particular dielectric material but can also be a stack of several different dielectric materials. Subsequently, said conductive sheets 2 may be thinned to a desired thickness by chemical or physical etching if necessary, in that the thinner conductive sheets 2 would normally be easier to form the finner circuit patterns in the current technological environment as recognized by those skilled in the art.

Figure 5A:
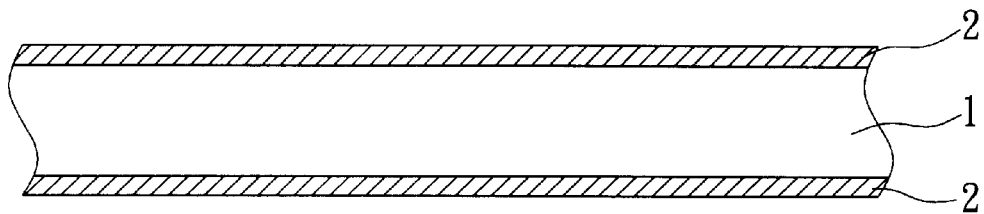
FIGS. 5A to 5F are cross-sectional views of process for fabricating a thin core substrate in accordance with a preferred embodiment of the present invention.
Figure 5B:
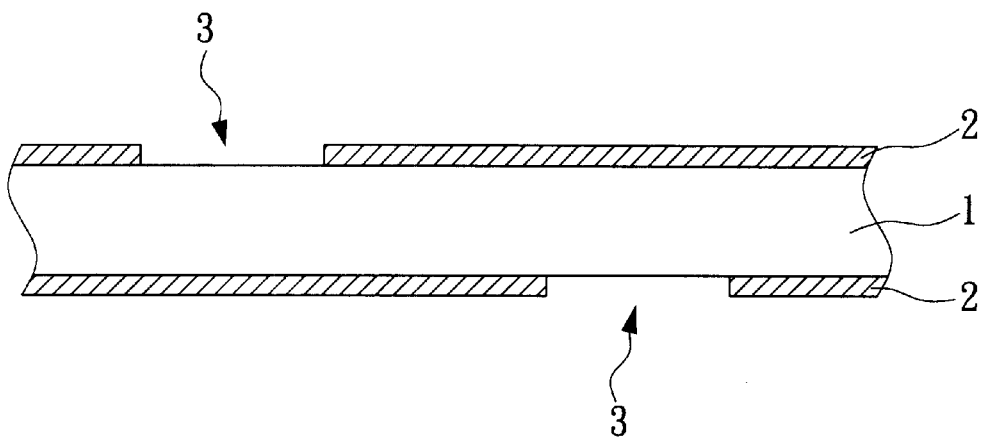
Figure 5C:
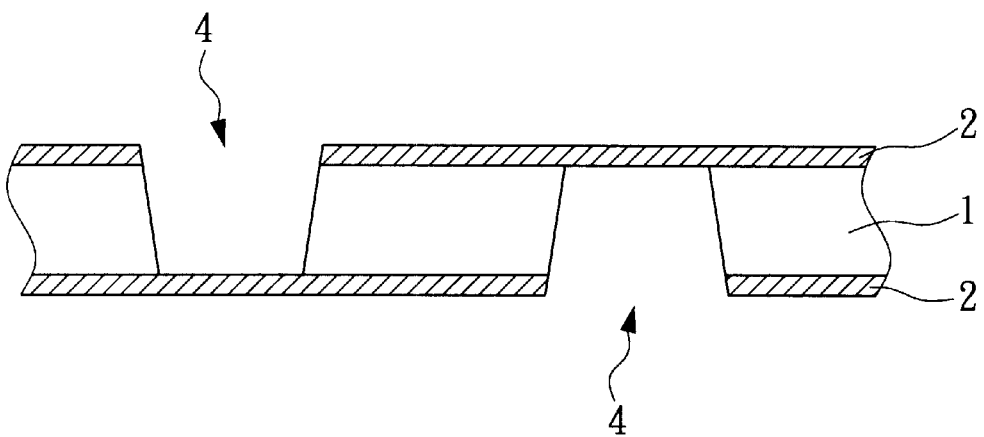

Thereafter, as shown in FIG. 5B, the openings 3 in said conductive sheets 2, preferably with an opening diameter of 0.005–0.1 millimeter, more preferably with a diameter of 0.02–0.04 millimeter, are formed by laser ablation or photoresist-etching process, etc., where the conductive material in said conductive sheets 2 is removed. FIG. 5C shows the formation of the blind via openings 4 in said insulating layer 1 which may be made by laser ablation, chemical etching or plasma etching, etc. Under such a condition, it should be noted that a photoimageable resin even used to be said insulating layer 1 would not work for forming such via openings 4 with assistance of the conventional photo-etching process, in that UV light may be blocked by said conductive sheets 2.

Figure 5D:
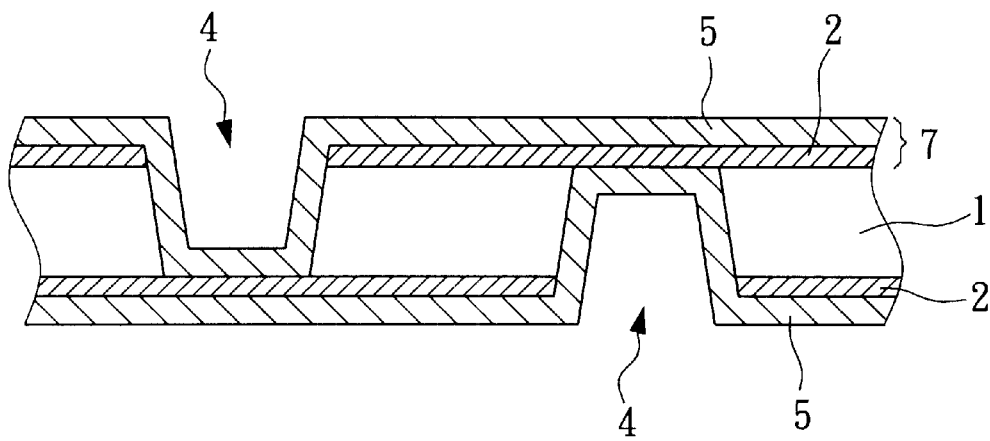
Figure 5E:
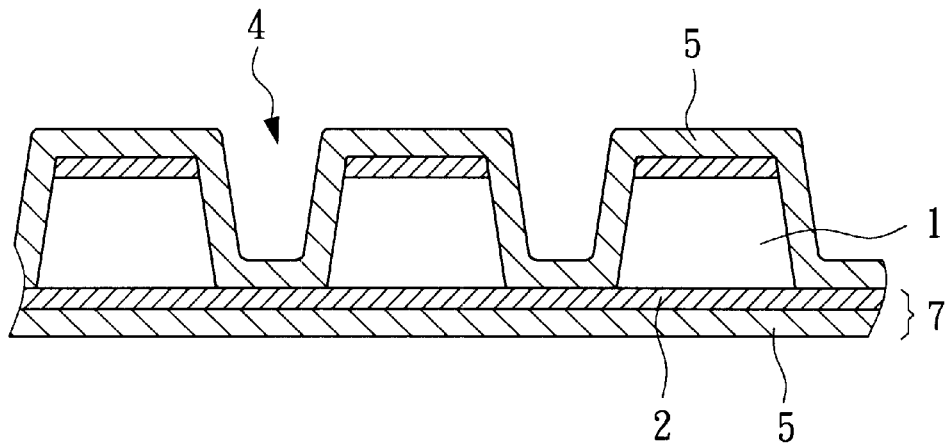
Figure 5F:
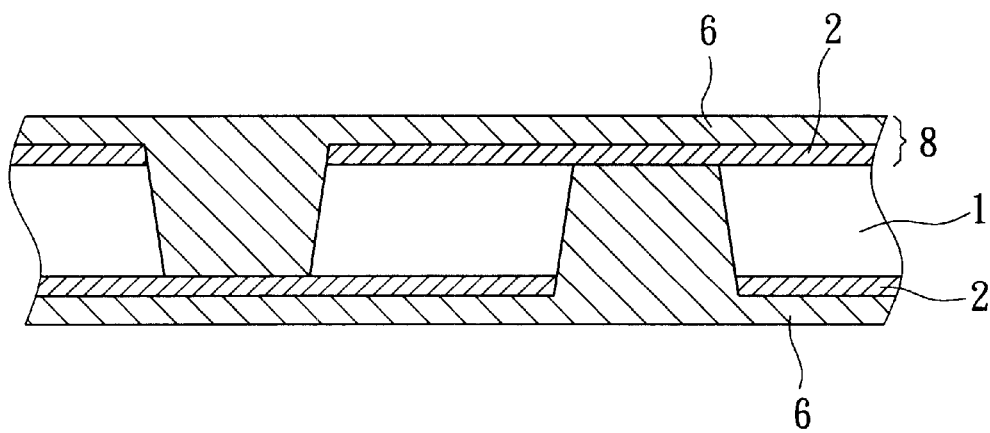

A conductive layer 5 or 6, as shown in FIG. 5D or 5F respectively, may be deposited by electroplating, electroless plating, sputtering, chemical vapor deposition, etc., on said conductive sheets 2 and/or said via openings 4; however, in such a case copper plating is preferred under consideration of cost performance. A via cleaning process, e.g. desmear process, plasma cleaning process, acid cleaning process or a combination thereof, and/or a roughening process may be conducted before the deposition of said conductive layer 5 or 6. It is here to be pointed out that, with the deposition of said conductive layer 5, said via openings 4 may be only partially filled and the recess is thus created as illustrated in FIGS. 5D, while in contrast with the deposition of said conductive layer 6 said via opening 4 alternatively may be completely filled as illustrated in FIG. 5F. According to the practical operations, when the via diameter is less than 0.05 millimeter, the via opening becomes much easier to be filled completely by plating copper, which therefore is quite beneficial for making stacked vias. After the circuit layer 7

(a combination of the layers 2 and 5) or 8 (a combination of the layers 2 and 6), preferably 0.008–0.015 millimeter thick, is patterned by laser ablation (so-called laser direct patterning method), chemical etching, or plasma etching etc., said core substrate 400 shown in FIG. 4A or 500 shown in FIG. 4B is thus constructed. As an alternative structural form, said via openings may also be directed toward the same side of said core substrate, as demonstrated schematically in FIG. 5E.

Figure 6A:
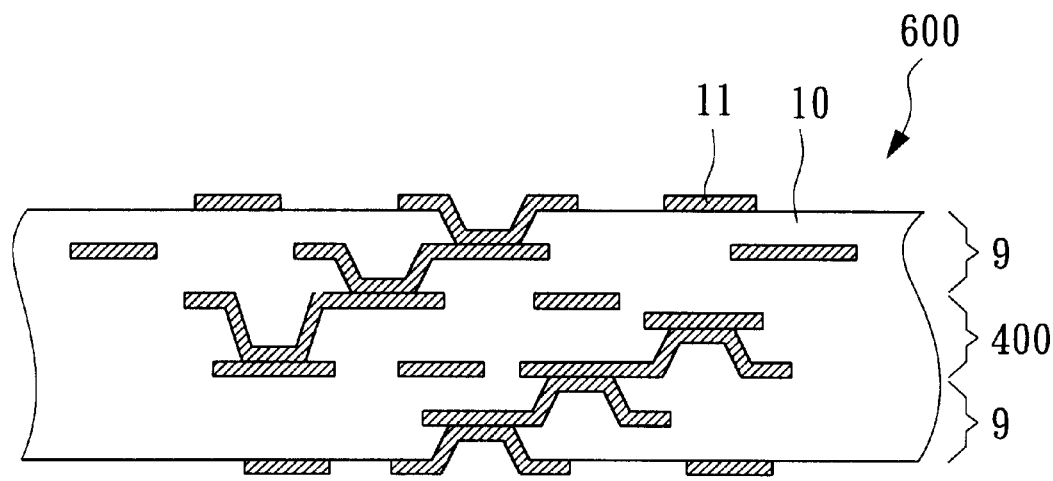
FIG. 6A is a cross-sectional view of a build-up circuit board with using a thin core in accordance with a preferred embodiment of the present invention.
Figure 6B:
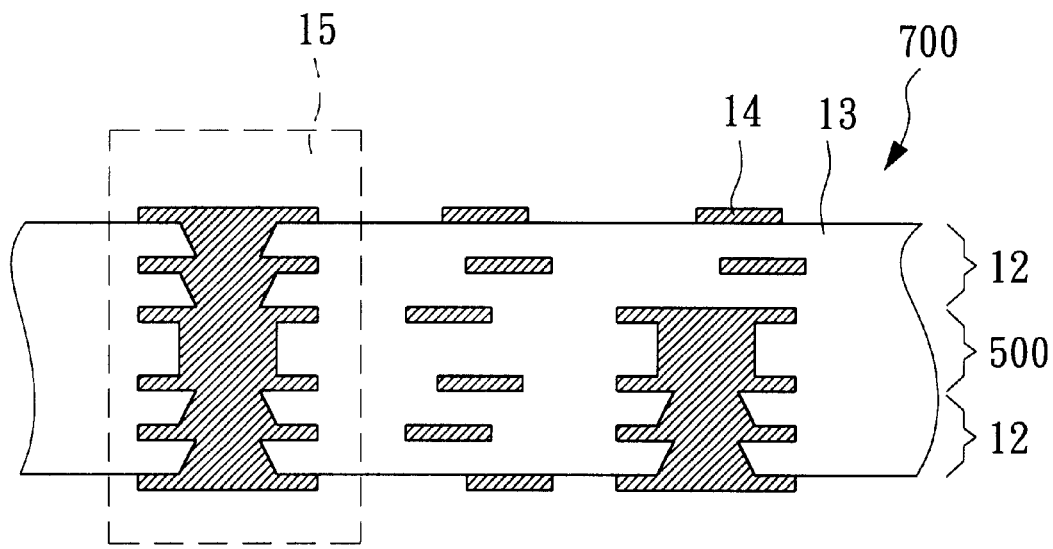
FIG. 6B is a cross-sectional view of a build-up circuit board with using a thin core in accordance with a preferred embodiment of the present invention.

According to the present invention, the build-up layer structure 9 containing the insulating layers 10 and conductive layers 11 may be formed on said core substrate 400 to construct a build-up multilayer circuit board 600, as shown in FIG. 6A, in which the recess is filled by a an insulating material coming from said insulating layer 10 during the deposition and hardening processes as well recognized by those skilled in the art. In the same manner, the build-up layer structure 12 containing the insulating layers 13 and conductive layers 14 may also be formed on said core substrate 500 to construct another build-up multilayer circuit board 700, as shown in FIG. 6B. It is to be noted that the so-called stacked vias 15 in said circuit board 700 can further offer a higher wiring density. Moreover, according to the present invention, said build-up multilayer circuit board 600 or 700 is also able to serve as a core substrate for subsequent formation of more build-up layers. However, these exemplary illustrations are not intended to limit the scope of this invention, while one skilled in the art will recognize that there are a number of build-up processes available in the art.

According to the present invention, whether for making said openings 3 in said conductive layers 2 or for patterning said conductive layer 7 or 8 by laser ablation, a far-infrared (FIR) laser beam with 9300–10600 nm wavelength emission, such as $CO_2$ lasers, or an ultraviolet (UV) laser beam with 355 nm or less wavelength emission, such as diode-pumped, solid-state, or excimer lasers can be used. However, if a FIR beam is used for making said openings 3, on the surface of said conductive sheets 2 should be formed an extra laser absorption layer, e.g. a surface oxide layer, to decrease laser beam reflection, which inevitably should be removed before the deposition of said conductive layers 5 and 6. In contrast, if a UV laser beam is used, said openings 3 can be made without forming any surface oxide layer. It is to be noted that, when FIR beam is used for patterning said conductive layer 7 or 8, the surface of said conductive layer 7 or 8 is better roughened first and then formed a surface oxide layer to decrease laser beam reflection, which would result in enhancing not only laser beam absorption but also adhesion property. If an UV laser beam is used, said circuit layer 7 or 8 can be directly patterned without forming any surface oxide layer in advance. But after patterning with an UV beam, the surface of said circuit layer 7 or 8 may be roughened chemically or physically and formed an oxide layer thereon to enhance adhesion property.

While novel features of the present invention have been described with reference to one or more particular embodiments herein, those skilled in the art will recognize that many modifications and variations of the present invention are possible. Therefore, the scope of the present invention should be limited only by the following claims.

What is claimed is:

1. A method of making a thin core substrate for constructing a build-up multilayer circuit board, comprising:

providing an insulating layer having a first surface and a second surface opposite said first surface;

providing a first electrically conductive sheet being bonded to said first surface of said insulating layer, and a second electrically conductive sheet being bonded to said second surface of said insulative layer;

removing the conductive material in both of said first and second electrically conductive sheets and the insulating material in said insulating layer at the same predetermined positions to form a plurality of blind vias;

depositing an electrically conductive layer covering said blind vias and at least a portion of said electrically conductive sheets; and patterning said first, second electrically conductive sheets and said electrically conductive layer to form circuit layers.

2. The method of claim 1, wherein said blind vias have diameters in the range of 0.001 to 0.15 millimeter.

3. The method of claim 1, wherein said blind vias are partially filled by said electrically conductive layer.

4. The method of claim 1, wherein said blind vias are fully filled by said electrically conductive layer.

5. The method of claim 1, wherein the surface of said electrically conductive sheets is roughened before the deposition of said electrically conductive layer.

6. A method of making a thin core substrate for constructing a build-up multilayer circuit board, comprising:

providing a first electrically conductive sheet being bonded to said first surface of said insulating layer, and a second electrically conductive sheet being bonded to said second surface of said insulative layer;

removing the conductive material in both of said first and second electrically conductive sheets and the insulating material in said insulating layer at the same predetermined positions to form a plurality of blind vias;

depositing an electrically conductive layer covering said blind vias and at least a portion of said electrically conductive sheets;

patterning said first and second electrically conductive sheets and said electrically conductive layer to form circuit layers to be a core substrate;

bonding at least one build-up layer on at least one side of said core substrate to form a build-up multilayer circuit board.

7. The method of claim 6, wherein said blind vias have diameters in the range of 0.001 to 0.15 millimeter.

8. The method of claim 6, wherein said blind vias are partially filled by said electrically conductive layer.

9. The method of claim 6, wherein said blind vias are fully filled by said electrically conductive layer.

10. The method of claim 6, wherein the surface of said electrically conductive sheets is roughened before the deposition of said electrically conductive layer.

* * * * *